United States Patent
Hu et al.

(10) Patent No.: US 6,953,749 B2
(45) Date of Patent: Oct. 11, 2005

(54) METHODS OF FORMING REFRACTORY METAL SILICIDE COMPONENTS AND METHODS OF RESTRICTING SILICON SURFACE MIGRATION OF A SILICON STRUCTURE

(75) Inventors: Yongjun Hu, Boise, ID (US); Jigish D. Trivedi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 684 days.

(21) Appl. No.: 09/798,404

(22) Filed: Mar. 2, 2001

(65) Prior Publication Data

US 2004/0132286 A9 Jul. 8, 2004

Related U.S. Application Data

(62) Division of application No. 09/596,231, filed on Jun. 13, 2000, now Pat. No. 6,468,905.

(51) Int. Cl.$^7$ ............................................. H01L 21/44
(52) U.S. Cl. ....................... 438/683; 438/653; 438/643; 438/685; 438/644; 438/655
(58) Field of Search ................................. 438/643, 644, 438/653, 655, 683, 685

(56) References Cited

U.S. PATENT DOCUMENTS

| | | | |
|---|---|---|---|
| 4,567,058 A | 1/1986 | Koh | 427/55 |
| 5,196,360 A | 3/1993 | Doan et al. | 437/41 |
| 5,306,951 A | 4/1994 | Lee et al. | 257/755 |
| 5,389,575 A | 2/1995 | Chin et al. | 437/190 |
| 5,508,212 A | 4/1996 | Wang et al. | 437/24 |
| 5,517,744 A | 5/1996 | Kanalyama et al. | |
| 5,610,099 A | 3/1997 | Stevens et al. | |
| 5,612,253 A * | 3/1997 | Farahani et al. | 437/190 |
| 5,614,437 A | 3/1997 | Choudhury | 437/140 |
| 5,633,200 A | 5/1997 | Hu | 438/453 |
| 5,741,721 A | 4/1998 | Stevens | 437/60 |
| 5,743,725 A | 4/1998 | Leung et al. | 437/200 |
| 5,754,390 A | 5/1998 | Sandhu et al. | |
| 5,776,831 A | 7/1998 | Padmanabhan et al. | 438/653 |
| 5,856,237 A | 1/1999 | Ku | 438/483 |
| 6,156,647 A * | 12/2000 | Hogan | 438/653 |

OTHER PUBLICATIONS

A. E. Morgan et al., "Interactions of thin TI films with Si, $SiO_2$, $Si_2N_4$, and $SiO_2$, under rapid thermal annealaing", J. Appl. Phys., vol. 64, No. 1, Jul. 1988, pp. 344–353.

* cited by examiner

Primary Examiner—Davids Nelms
Assistant Examiner—Renee R Berry
(74) Attorney, Agent, or Firm—Wells St. John P.S.

(57) ABSTRACT

Methods of forming refractory metal suicide components are described. In accordance with one implementation, a refractory metal layer is formed over a substrate. A silicon-containing structure is formed over the refractory metal layer and a silicon diffusion restricting layer is formed over at least some of the silicon-containing structure. The substrate is subsequently annealed at a temperature which is sufficient to cause a reaction between at least some of the refractory metal layer and at least some of the silicon-containing structure to at least partially form a refractory metal silicide component. In accordance with one aspect of the invention, a silicon diffusion restricting layer is formed over or within the refractory metal layer in a step which is common with the forming of the silicon diffusion restricting layer over the silicon-containing structure. In a preferred implementation, the silicon diffusion restricting layers are formed by exposing the substrate to nitridizing conditions which are sufficient to form a nitride-containing layer over the silicon-containing structure, and a refractory metal nitride compound within the refractory metal layer. A preferred refractory metal is titanium.

11 Claims, 5 Drawing Sheets

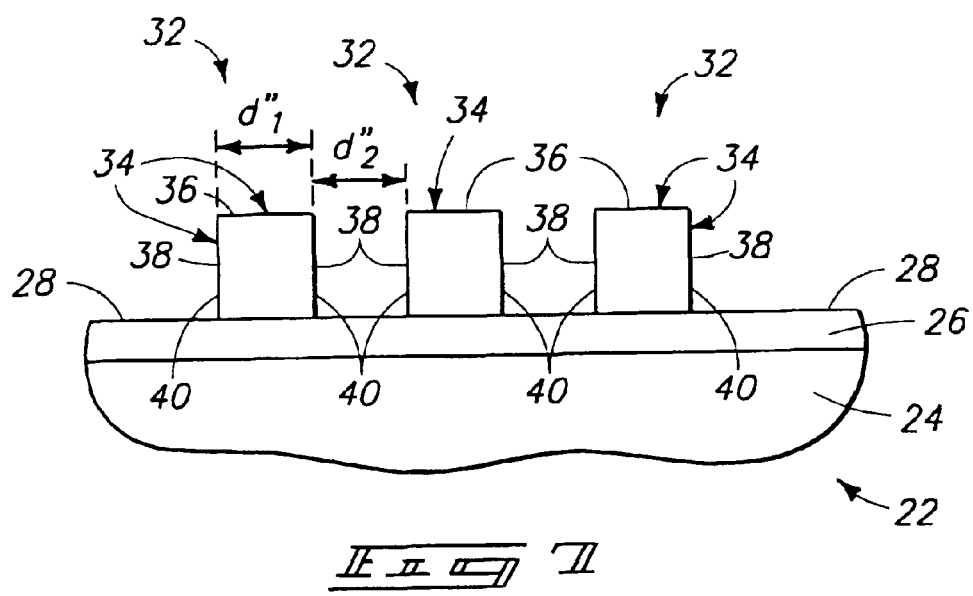
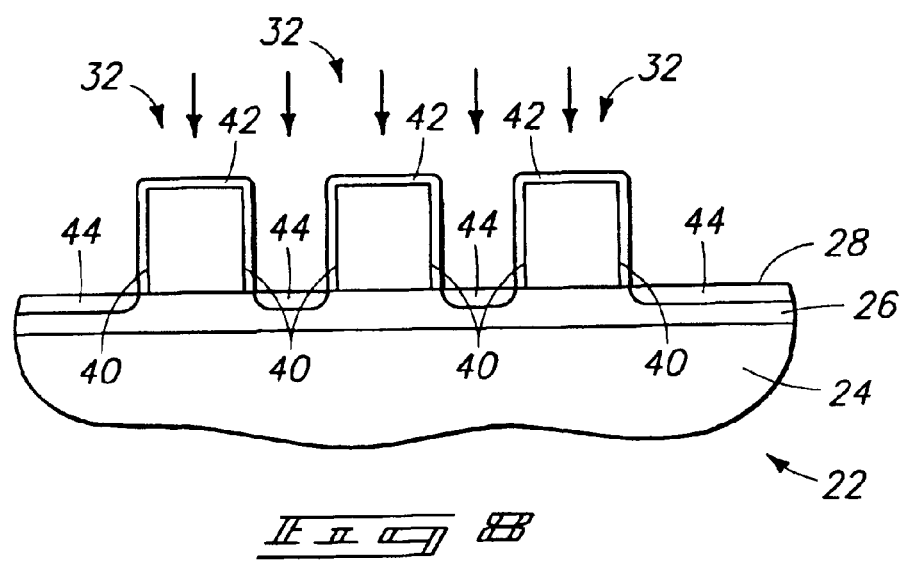

US 6,953,749 B2

METHODS OF FORMING REFRACTORY METAL SILICIDE COMPONENTS AND METHODS OF RESTRICTING SILICON SURFACE MIGRATION OF A SILICON STRUCTURE

This patent is a divisional application of U.S. patent application Ser. No. 091596,231, filed on Jun. 13, 2000, now U.S. Pat. No. 6,488,905 B1, which is a continuation application of U.S. patent application Ser. No. 08/910,908, filed on Aug. 13, 1997, now U.S. Pat. No. 6,127,270.

PATENT RIGHTS STATEMENT

This invention was made with Government support under Contract No. MDA972-92-C-0054 awarded by Advanced Research Projects Agency (ARPA). The Government has certain rights in this invention.

TECHNICAL FIELD

This invention relates to methods of forming refractory metal silicide components and methods of restricting silicon surface migration of an etched silicon structure relative to a surface of an underlying refractory metal layer.

BACKGROUND OF THE INVENTION

Fabrication of semiconductor devices involves forming electrical interconnections between electrical components on a wafer. Electrical components include transistors and other devices which can be fabricated on the wafer. One type of electrical interconnection comprises a conductive silicide line the advantages of which include higher conductivities and accordingly, lower resistivitires.

Typically, conductive silicide components can be formed by blanket depositing a layer of refractory metal over the wafer and then blanket depositing a layer of silicon over the refractory metal layer. For example, referring to FIG. 1, an exemplary wafer fragment in process is shown generally at 10 and includes a substrate 12. Exemplary materials for substrate 12 comprise suitable semiconductive substrate materials and/or other insulative materials such as $SiO_2$. As used is this document, the term "semiconductive substrate" will be understood to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. A refractory metal layer 14 is formed over substrate 12 followed by formation of a layer 16 of silicon.

Referring to FIG. 2, layer 16 is patterned and etched to form a plurality of silicon-containing structures 17. Silicon-containing structures 17 constitute structures from which electrical interconnects are to be formed relative to wafer 10. The etching of the silicon-containing structures defines a silicon-containing structure dimension $d_1$ and a silicon-containing structure separation distance $d_2$. In the illustrated example, $d_1$ is substantially equal to $d_2$. Such relationship between $d_1$ and $d_2$ results from a desire to use as much of the wafer real estate as is available. Accordingly, the spacing between the silicon-containing structures reflects a critical dimension which is a function of the limitations defined by the photolithography technology available. The goal is to get the silicon-containing structures as close as possible to conserve wafer real estate.

Referring to FIG. 3, substrate 12 is exposed to suitable conditions to cause a reaction between the refractory metal layer 14 and the silicon-containing structures 17. Typical conditions include a high temperature annealing step conducted at a temperature of about 675° C. for about 40 seconds. Subsequently, the unreacted refractory metal is stripped from the wafer. The resulting refractory metal silicide components or lines are illustrated at 18 where the resulting line dimensions $d_1'$ can be seen to be larger than the silicon-containing structure dimensions $d_1$ (FIG. 2) from which each was formed. Accordingly, the relative spacing or separation between the lines is illustrated at $d_2'$. With the attendant widening of the silicide components or lines, the separation distance between them is correspondingly reduced. A major cause of this widening is the diffusive nature of the silicon from which the FIG. 2 silicon-containing structures are formed. That is, because silicon is highly diffusive in nature, the formation of the FIG. 3 silicide components causes a surface migration of the silicon relative to the underlying substrate. In the past, when device dimensions were larger, the migration of silicon during silicide formation was not a problem. Adequate spacing between the resulting silicide lines ensured that there would be much less chance of two or more components shorting together. However, as device dimensions grow smaller, particularly at the 0.35 μm generation and beyond, there is an increased chance of shorting. This is effectively illustrated in FIG. 4 where two refractory metal components 19 can be seen to engage one another and hence short together at 20.

This invention grew out of concerns associated with forming silicide components. This invention also grew out of concerns associated with improving the integrity of electrical interconnections as device dimensions grow ever smaller.

SUMMARY OF THE INVENTION

Methods of forming refractory metal silicide components are described. In accordance with one implementation, a refractory metal layer is formed over a substrate. A silicon-containing structure is formed over the refractory metal layer and a silicon diffusion restricting layer is formed over at least some of the silicon-containing structure. The substrate is subsequently annealed at a temperature which is sufficient to cause a reaction between at least some of the refractory metal layer and at least some of the silicon-containing structure to at least partially form a refractory metal silicide component. In accordance with one aspect of the invention, a silicon diffusion restricting layer is formed over or within the refractory metal layer in a step which is common with the forming of the silicon diffusion restricting layer over the silicon-containing structure. In a preferred implementation, the silicon diffusion restricting layers are formed by exposing the substrate to nitridizing conditions which are sufficient to form a nitride-containing layer over the silicon-containing structure, and a refractory metal nitride compound within the refractory metal layer. A preferred refractory metal is titanium.

BRIEF DESCRIPTION OF THE DRAWINGS

Preferred embodiments of the invention are described below with reference to the following accompanying drawings.

FIG. 7 is a view of the FIG. 5 wafer fragment at a processing step subsequent to that shown by FIG. 6.

FIG. 8 is a view of the FIG. 5 wafer fragment at a processing step subsequent to that shown by FIG. 7.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
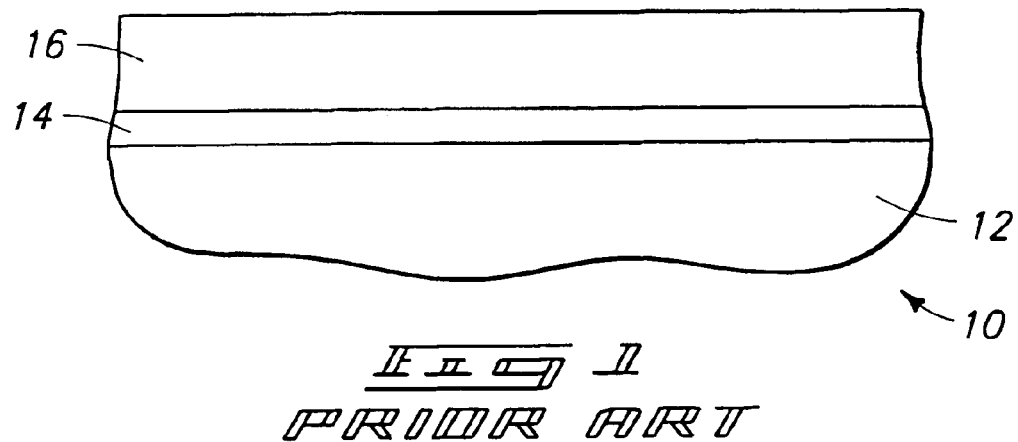
FIG. 1 is a diagrammatic sectional view of a semiconductor wafer fragment at one prior art processing step.
Figure 2:
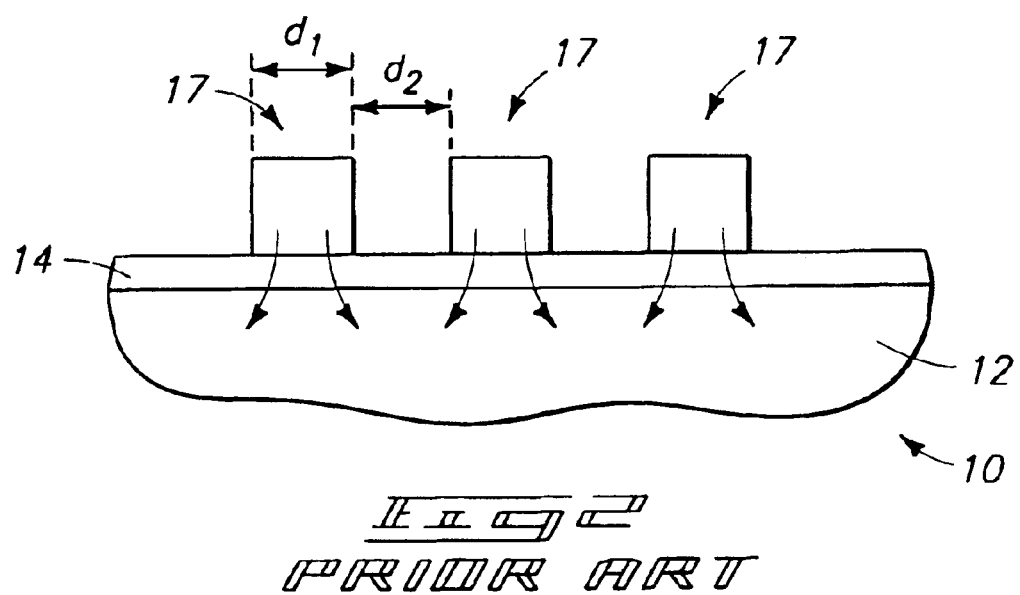
FIG. 2 is a view of the FIG. 1 wafer fragment at a processing step subsequent to that shown by FIG. 1.
Figure 3:
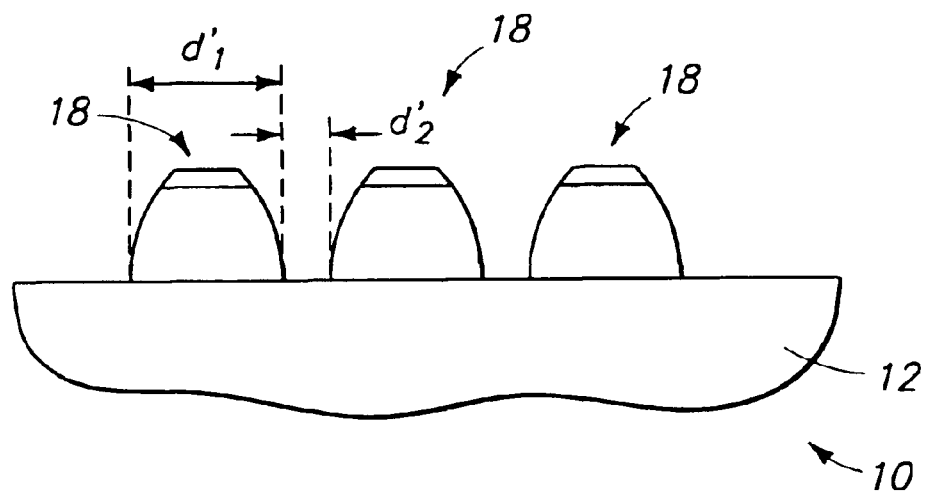
FIG. 3 is a view of the FIG. 1 wafer fragment at a processing step subsequent to that shown by FIG. 2.
Figure 4:
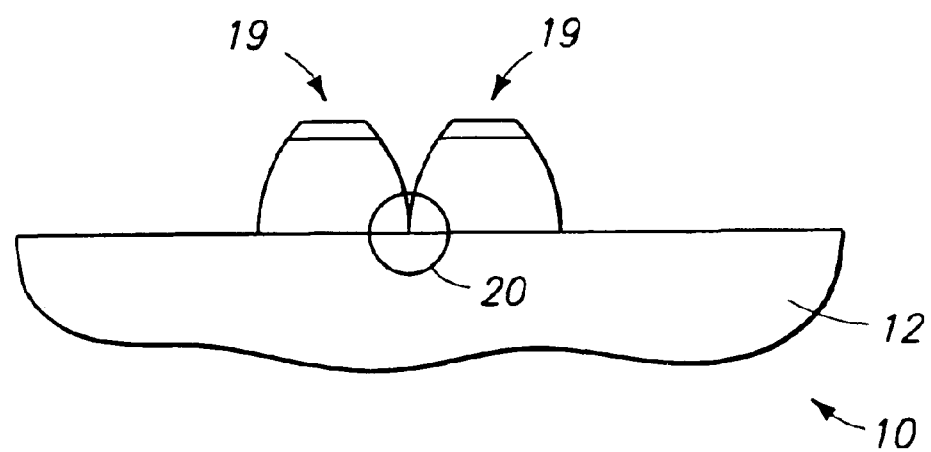
FIG. 4 is a view of the FIG. 1 wafer fragment at a processing step subsequent to that shown by FIG. 3.
Figure 5:
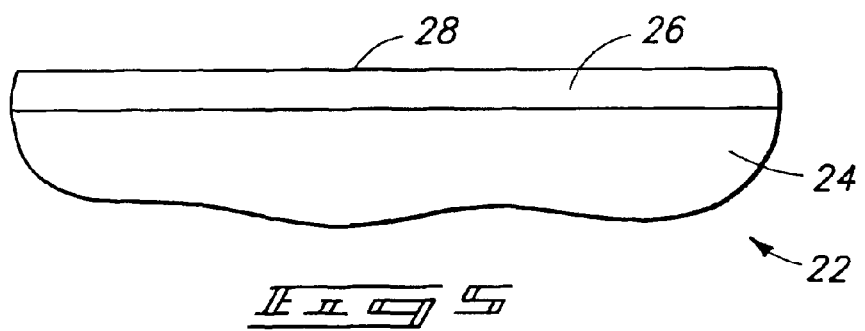
FIG. 5 is a diagrammatic sectional view of a semiconductor wafer fragment at one processing step in accordance with the invention.

Referring to FIG. 5, a semiconductor wafer fragment, in process, is shown generally at 22 and includes substrate 24. Substrate 24 can constitute a semiconductive substrate or an insulative substrate. A refractory metal layer 26 is formed over substrate 24 and includes an outer exposed surface 28. An exemplary and preferred material for layer 26 is titanium. Other refractory metal materials can, of course, be utilized. An exemplary thickness for layer 26 is about 300 Angstroms.

Figure 6:
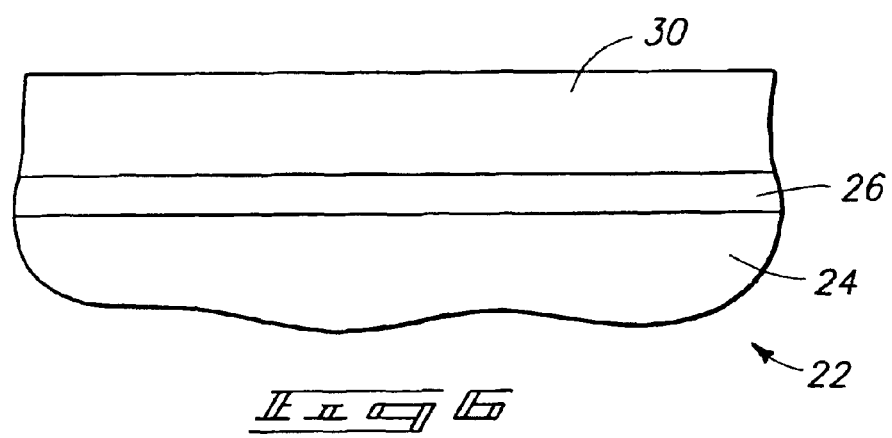
FIG. 6 is a view of the FIG. 5 wafer fragment at a processing step subsequent to that shown by FIG. 5.

Referring to FIG. 6, a silicon-containing layer 30 is formed over outer surface 28 of refractory metal layer 26. An exemplary thickness for layer 30 is about 1100 Angstroms.

Referring to FIG. 7, layer 30 is patterned and etched into a plurality of silicon-containing structures 32 over the substrate. Individual structures 32 have respective outer surfaces 34. Individual outer surfaces 34 are, in the illustrated example, defined by respective structure tops 36, and respective structure sidewalls 38. Adjacent structures have respective sidewalls which face one another. Individual structures 32 also include respective silicon-containing portions 40 which are disposed proximate refractory metal layer outer surface 28. In a preferred implementation, silicon-containing structures 32 have structure dimensions $d_1''$, and adjacent silicon-containing structures 32 constitute respective pairs of structures having first lateral separation distances or spacings $d_2''$ (illustrated for the left-most pair of structures). In accordance with this implementation, $d_1''$ and $d_2''$ are no greater than about 0.35 μm.

Referring to FIG. 8, substrate 24 is exposed to conditions which are effective to form silicon diffusion restricting layers 42 over at least some of the silicon-containing portions 40 proximate outer surface 28 of the refractory metal layer 26. Preferably, the silicon diffusion restricting layers 42 cover the entirety of the individual silicon-containing structures 32 and are formed to a relative thickness of no less than about 10 Angstroms. Even more preferably, the thickness of layers 42 is between about 10 to 20 Angstroms. Accordingly, the respective sidewalls of the individual structures 32 are covered with respective silicon diffusion restricting layers. According to another aspect of the invention, the conditions which are effective to form silicon diffusion restricting layers 42 are also effective to form silicon diffusion restricting layers or regions 44 over or within refractory metal layer 26. Exemplary and preferred elevational thicknesses of layers 44 are less than or equal to about 50 Angstroms. Accordingly, layers 42 constitute first silicon diffusion restricting structures or layers and layers/regions 44 constitute second silicon diffusion restricting structures or layers.

In a preferred implementation, the silicon-containing structures 32 and the refractory metal layer surface 28 are exposed to nitridizing conditions in a common step. Such conditions are preferably effective to cover the respective silicon-containing structures with nitride-containing material (layers 42) such as silicon nitride, and form nitride-containing material layers 44 within the refractory metal layer between the silicon-containing structures. In this implementation, nitride-containing material layers 44 constitute a refractory metal nitride compound such as $TiN_x$, with titanium being a preferred refractory metal material as mentioned above. Exemplary and preferred nitridizing conditions in a cold wall reactor comprise a low pressure (about 1 Torr), low temperature $N_2/H_2$ atomic plasma at a reactor power of 200 Watts to 800 Watts. Flow rates are respectively about 100 to 300 sccm for $N_2$ and 450 sccm for $H_2$. Addition of $H_2$ into $N_2$ plasma reduces if not eliminates oxidation of the exposed refractory metal surface. Suitable temperature conditions for such nitridizing include temperatures between about 250° C. to 450° C., with temperatures between 375° C. and 400° C. being preferred. Preferred exposure times under such conditions range between 30 to 60 seconds. The above processing conditions are only exemplary and/or preferred processing conditions. Accordingly, other processing conditions or deposition techniques are possible.

Figure 9:
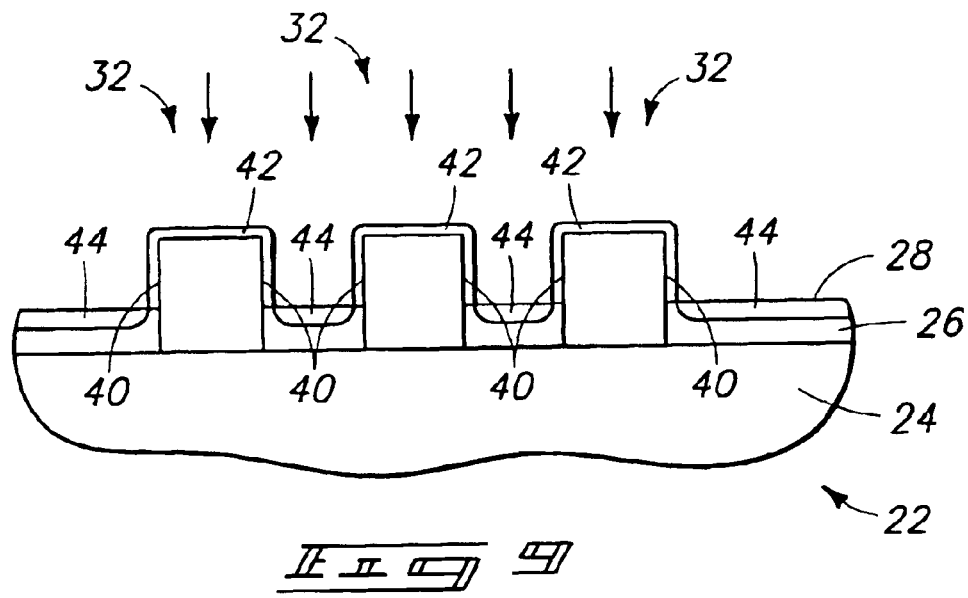
FIG. 9 is a view of the FIG. 5 wafer fragment at a processing step subsequent to that shown by FIG. 8.
Figure 10:
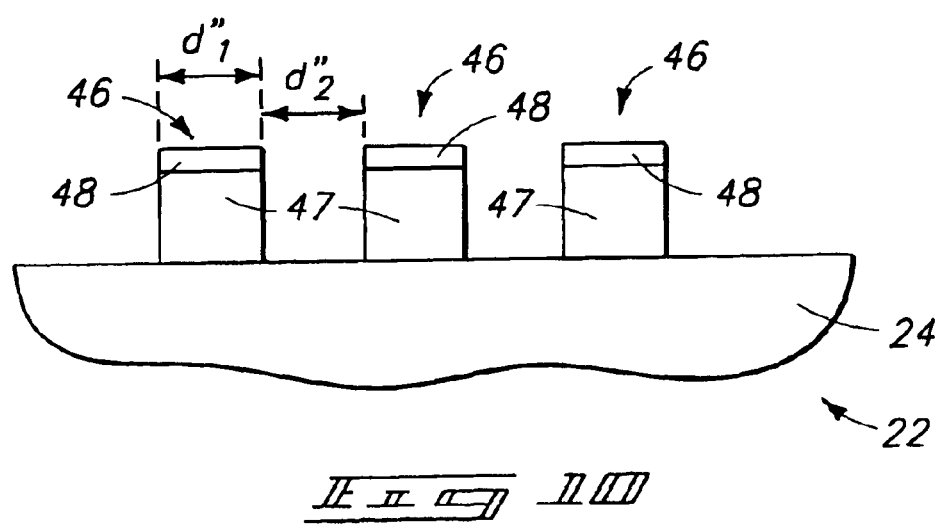
FIG. 10 is a view of the FIG. 5 wafer fragment at a processing step subsequent to that shown by FIG. 8.

Referring to FIGS. 9 and 10, and after the formation of the above described silicon diffusion restricting layers, substrate 24 is annealed to a degree sufficient to react at least some of the material of the silicon-containing structures with at least some of the refractory metal material. FIG. 9 shows an intermediate substrate construction during such annealing thereof. Suitable processing conditions include a temperature of about 675° C. for about 40 seconds in $N_2$. Accordingly, such forms respective refractory metal silicide components 46. Silicide components 46 can include respective silicide portions 47 and unreacted silicon portions 48. After forming components 46, substrate 24 can be subjected to a stripping step comprising a mix of ammonia and peroxide. In a preferred implementation, such refractory metal silicide components constitute conductive lines which electrically interconnect various integrated circuitry devices or portions thereof. In an exemplary and preferred implementation, components 46 constitute at least a portion of a local interconnect for a static random access memory cell. In the illustrated example, the silicon diffusion restricting layers are effective to restrict silicon lateral diffusion during the annealing step just mentioned. Accordingly, with silicon surface and other diffusion reduced, if not eliminated, the respective silicide components 46 have a second lateral distance or spacing $d_2''$ therebetween which is substantially the same as the FIG. 7 first lateral distance or spacing $d_2''$. In processing regimes where a critical dimension of 0.35 μm is a design rule, such second lateral distance would be about 0.35 μm. Accordingly, line dimensions $d_1''$ are substantially equal to lateral distance or spacing $d_2''$ and do not meaningfully varying from the FIG. 7 pre-annealing dimensions or spacings.

The above described methodology enables refractory silicide components to be formed which are substantially free from lateral silicon diffusion during salicidation. Thus, closer relative spacing of such components can be achieved with risks associated with grounding or shorting of the components reduced.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a silicon migration restricting region, comprising:

depositing a refractory metal layer over a substrate, said layer having an outer surface;

forming a silicon-containing structure over a first region of said outer surface, said first region having a lateral dimension and further defines a second region of the outer surface, the second region of the outer surface being exposed; and converting a portion of said second region into said silicon migration restricting region.

2. The method of claim 1, wherein the forming a silicon-containing structure further comprises:

depositing a silicon-containing layer over said refractory metal layer; and patterning said silicon-containing layer to form the silicon-containing structure.

3. The method of claim 1, wherein the refractory metal layer comprises titanium.

4. The method of claim 1, further comprising annealing said silicon-containing structure and said refractory metal layer at a temperature sufficient to cause a silicide forming reaction, a refractory metal silicide being formed of at least a portion of said first region.

5. The method of claim 4, wherein the silicide forming reaction forms titanium silicide.

6. The method of claim 4, wherein the silicide portion of said first region spans the length of the lateral dimension.

7. The method of claim 1, wherein converting the portion further comprises exposing the portion to an atomic plasma, the atomic plasma comprising atomic nitrogen and atomic hydrogen.

8. The method of claim 7, wherein exposing the portion to an atomic plasma further comprises exposing the portion to a temperature of from about 250° C. to about 450° C.

9. The method of claim 7, wherein exposing the portion to an atomic plasma further comprises exposing the portion to a temperature of from about 375° C. to about 400° C.

10. The method of claim 1, wherein converting a portion of said second region into said silicon migration restricting region further comprises forming said restricting region to have an elevational thickness within said second region of less than or equal to 50 Angstroms.

11. The method of claim 1, further comprising patterning said refractory metal layer to form a conductive line, the conductive line comprising at least a portion of a local interconnect for a static random access memory cell.

* * * * *

UNITED STATES PATENT AND TRADEMARK OFFICE
CERTIFICATE OF CORRECTION

PATENT NO. : 6,953,749 B2 Page 1 of 1
APPLICATION NO. : 09/798404
DATED : October 11, 2005
INVENTOR(S) : Hu et al.

It is certified that error appears in the above-identified patent and that said Letters Patent is hereby corrected as shown below:

Title Page, References Cited, U.S. PATENT DOCUMENTS, please insert --5,597,744 1/1997 Kamiyama et al.-- before "5,610,099".

Title Page, References Cited, U.S. PATENT DOCUMENTS, please insert --5,741,725 4/1998 Inoue et al.-- before "5,743,725".

Title Page, References Cited, OTHER PUBLICATIONS, line 2 of the "A.E. Morgan Reference", please delete "annelaing" after "thermal" and insert --annealing",--.

Title Page, Abstract, line 1, please delete "suicide" after "metal" and insert --silicide--.

Col. 1, line 8, please delete "091596,231," after "Ser.No." and insert --09/596,231,--.

Col. 1, line 9, please delete "6,488,905 B1" after "No." and insert --6,468,905 B1--.

Col. 17, line 42, please delete "is" after "used" and insert --in--.

Col. 4, line 64, please delete "varying" after "ingfully" and insert --vary--.

Signed and Sealed this

Nineteenth Day of December, 2006

JON W. DUDAS
*Director of the United States Patent and Trademark Office*